April 20, 1954 E. G. BALDWIN 2,676,271

TRANSISTOR GATE

Filed Jan. 25, 1952

INVENTOR
E. G. BALDWIN
BY H. A. Burgess
ATTORNEY

Patented Apr. 20, 1954

2,676,271

UNITED STATES PATENT OFFICE 2,676,271

TRANSISTOR GATE

Edwin G. Baldwin, East Orange, N. J., assignor to Bell Telephone Laboratories, Incorporated, New York, N. Y., a corporation of New York Application January 25, 1952, Serial No. 268,218

8 Claims. (Cl. 307—88)

Figure 1:
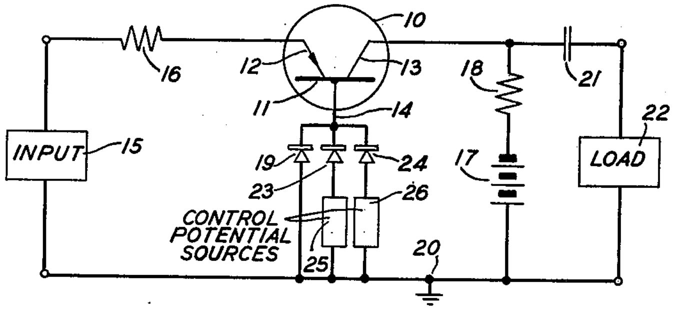

This invention relates to electronic gating circuits which employ semiconductor translating devices.

It is an object of the invention to controllaby gate an input signal and at the same time to amplify the signal being gated.

It is also an object of the invention to increase the "Off/On" loss ratio of a transmission type gate.

Other objects of the invention relate to the general improvement of high speed transmission type gating circuits.

The circuits illustrative of the present invention and described in detail below utilize transistor action and in some embodiments conventional transistors to achieve amplification in a transmission type gate. Transistors are described, for example, in an article entilted "Some circuit aspects of the transistor," by R. M. Ryder and R. J. Kircher, which appears in the Bell System Technical Journal for July 1949, and in patent 2,524,035, to J. Bardeen and W. H. Brattain, dated October 3, 1950.

One type of transistor, designated the point contact or type A, comprises in one of its forms a semiconductive body with which an emitter and collector electrode make point contact and with which the base electrode makes a large area ohmic contact. The semiconductive body which may, for example, comprise germanium may be either p- or n-type material. With n-type material, the emitter current in the active region will flow into the semiconductive body, and the collector current will flow out of the body; the reverse will be true of p-type units. Most point contact transistors thus far fabricated display the phenomenon of current multiplication, e. e., increases in the current flowing in the emitter electrode will result in even larger increases in the current flowing in the collector electrode. Other types of transistors employ the rectifying properties of p-n junctions to perform the functions of emitter and collector electrodes and are known, for example, as n-p-n or p-n-p transistors. Other types, known as phototransistors, employ light-sensitive semiconductive material; the light may be used in place of or in addition to an emitter electrode to exert control over the collector current.

The circuits described below, which employ transistors, are described as relating to n-type point contact transistors. In accordance with the usual convention, electrode currents for this type of transistor are deemed positive if they flow from the electrode into the semiconductive body.

It should be understood, however, that the invention is not limited to this type of transistor since other types may also be employed to advantage.

In accordance with an illustrative embodiment of the invention described in more detail below, an asymmetrically conducting impedance element, such as a germanium crystal diode, is connected in series with the base electrode of a transistor connected in grounded base configuration. Other asymmetrical devices or diodes have similar electrodes either connected together and to the base electrode or directly to the semiconductive body of the transistor. Control potentials applied to the other terminals of these latter diodes control the forward transmission loss of the gate by biasing the first diode in either its high or its low resistance condition.

The term "transmission type gate" is used herein in contradistinction to switching type gates. Switching type gates, for example, of the type disclosed in a copending application of L. W. Hussey, Serial No. 198,688, filed December 1, 1950, which issued as Patent 2,636,133, dated April 21, 1953, merely pass or switch a signal of predetermined amplitude and wave form to a load in response to a prescribed set of conditions, such as a coincidence or non-coincidence of applied control voltages. Transmission type gates, however, pass a more or less accurate replica of the input signal to the load in response to the prescribed set of conditions; an example of this type of gate may be seen by referring to W. D. Lewis Patent 2,535,303, dated December 26, 1950. A feature of the present invention is that in certain embodiments not only is a more or less accurate replica of the input signal switched to the load under a prescribed set of conditions but the gated segment is amplified during the gating process by the gate itself. Succeeding stages of amplification may therefore be avoided.

Figure 2:
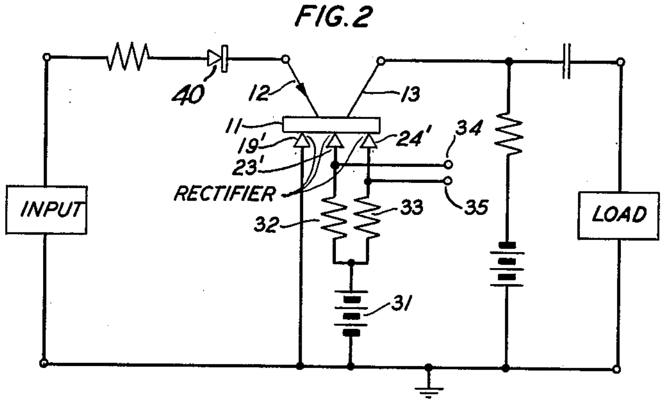
Figure 3:
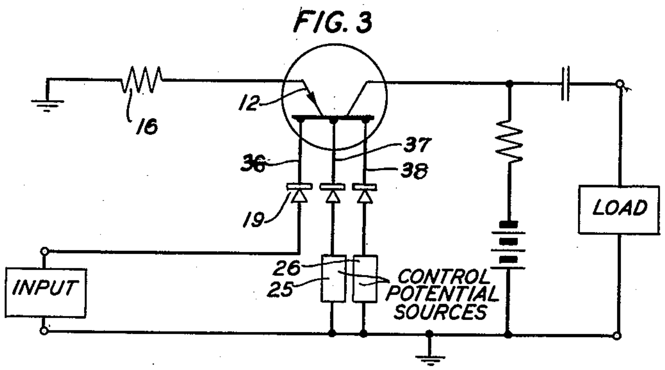

The invention, its objects, and features may be better understood from a consideration of the following detailed description when read in accordance with the attached drawing, in which:

Figs. 1, 2, and 3 illustrate verious embodiments of an electronic gate embodying principles of the present invention.

The circuit shown in Fig. 1 employs a conventional n-type point contact transistor 10 of the type described above having a body of semiconductive material 11, an emitter electrode 12, a collector electrode 13, and a base electrode 14. The emitter and base electrodes are interconnected by a circuit which includes an input 15 and a series resistor 16. The input may, for example, comprise a source of signals to be gated. The collector and base electrodes are interconnected by a circuit which includes a battery 17 which is the collector supply battery and a current limiting or load resistor 18. In series with the base electrode and common to the circuits just described is an asymmetrically conducting impedance element, for example, a germanium crystal diode 19. The terminal of the diode 19 remote from the base electrode 14 is grounded at 20, thereby providing an arbitrary point of reference potential. Output is taken from the collector electrode and applied by means of the blocking condenser 21 to the load 22 connected between the collector and ground. Inductive coupling could, of course, be alternatively employed in an obvious manner to apply ouput signals to the load.

Since the collector current in the active region exceeds the emitter current, the base current in this region will be positive, normal collector current being negative. The diode 19 is therefore poled for forward or low resistance transmission in the direction of normal base current in the active region. Further, due to the small voltage drop across the diode 19 in its low resistance condition, the base electrode will be slightly negative with respect to the emitter, providing positive bias for the latter. Further positive bias may be supplied by an emitter biasing battery connected in an obvious manner between the emitter 12 and ground.

The diodes 23 and 24 provide the means for controlling the forward transmission loss of the gate. These latter diodes are poled similarly to the diode 19, and all three diodes have similar electrodes, viz., their "cathodes," connected together and to the base electrode. The sources 25 and 26 supply control potentials of either polarity in series with their associated diode. If the control voltages are both negative with respect to the potential of the base electrode 14, the diodes 23 and 24 will be biased in their high resistance condition and will have substantially no effect on the forward transmission of a signal from the input 15 to the load 22. In other words, if the applied control voltages are both negative with respect to ground 20, the switch will be "on." If either control voltage is positive by a sufficient amount, it will bias the control diode 23 or 24 to which it is applied to a low resistance and turn the switch "off" by biasing the base diode 19 to its high resistance condition. This results since, when either control diode 21 or 22 is in its low resistance condition, the positive control voltage is effectively applied with little loss directly to the base electrode 14 and hence also to the "cathode" of the base diode 19.

The transmission gate just described is normally "on." By the addition of the control biasing battery 31 and the biasing resistors 32 and 33, as shown in Fig. 2, the switch is normally "off." The battery 31 normally, i. e., in the absence of input signals, biases the control diodes in their low resistance condition, which places the base diode 19′ normally in its high resistance condition. In the circuit of Fig. 1, a positive control voltage applied to either of the control diodes will turn the normally "on" switch "off." In the circuit of Fig. 2, the control voltages applied to both control terminals 34 and 35 must be either grounded or driven negative in order to turn the switch "on." This circuit may therefore be called a coincidence or "and" gate. A diode 40 may be added in series with the emitter electrode, as shown in Fig. 2, to improve the emitter characteristic, if necessary.

Fig. 2 also illustrates a further modification of the gate shown in Fig. 1, more fully described in my copending application, Serial No. 268,219, filed January 25, 1952. In the gate of Fig. 2, the transistor and the control diodes are combined in a single translating unit. The emitter and collector electrodes 12 and 13 make point contact with the semiconductor body 11 as they normally do with point contact transistors. The conventional base electrode, however, is omitted, and the diode points for the control diodes are formed with the same body of germanium or other semiconductor material which is employed by the transistor. These points 19′, 23′, and 24′, and particularly the point 19′, serve the function of base electrode as well as that of control diode. Although the use of point contacts for a base electrode may give rise to an increase in hole injection by the base electrode, which is sometimes considered undesirable, the hole injection may be reduced to a sufficiently low level by keeping the diode points 19′, 23′, and 24′ relatively remote from the emitter and collector electrodes 12 and 13. This may be accomplished by placing them on the opposite side of a relatively thick body of germanium from the emitter and collector electrodes, or they may be on the same side of the body if it has a sufficiently large area. A careful choice of material for the diode points will also aid in minimizing hole injection; tungsten, for example, has been found particularly adaptable. Electrically, this unit will perform in the circuit of Fig. 2 substantially the same as if connected similarly to the circuit of Fig. 1. It permits, however, combining the switch within one envelope and obtains the combined function of transistor and three diodes with but a single semiconductor body and five point contact electrodes.

The circuit of Fig. 1 employs the grounded base configuraion. Grounded emitter configuration may also be used, as is illustrated in Fig. 3. The emitter electrode 12 is returned to ground through the series resistor 16, and the input circuit is connected in series with the base diode 19. The switching action of this gate is substantially the same as that of the Fig. 1 circuit and merely makes possible other combinations of impedance levels which may be needed in particular applications.

In Fig. 3, each diode is separately connected to the semiconductive body by way of electrodes 36, 37, and 38, which are each soldered to the base of the body, making low resistance contacts. Electrode 36 may be arbitrarily designated the base electrode, although all three combine, in a fashion, to perform this function. This merely illustrates an alternative constructional feature which does not appreciably alter the switching action.

Although the invention has been described as relating to specific embodiments, the invention should not be deemed limited to the specifically disclosed circuits since other embodiments and modifications will readily occur to one skilled in the art without departing from the spirit or scope of the invention. For example, the circuits illustrated may be combined in parallel similarly to Fig. 3A of the above-mentioned Lewis patent for multiplexing or other purposes.

What is claimed is:

1. An electronic gate comprising a translating device, said translating device comprising a body of semiconductive material having an emitter electrode, a collector electrode and base electrode means including a first asymmetrically conducting impedance element, a direct-current path including a source of potential, said collector electrode and said base electrode means, and means for controllably biasing said first asymmetrical element comprising a second asymmetrically conducting impedance element coupled to said first asymmetrical element and means for applying control potentials to said second asymmetrical impedance element.

2. The combination in accordance with claim 1 and a source of input signals connected in a circuit with said emitter electrode and said base electrode means.

3. The combination in accordance with claim 1, wherein the said first asymmetrical impedance element is returned to a point of reference potential, a source of input signals, and means for applying said input signals between said emitter electrode and said point of reference potential.

4. The combination in accordance with claim 1, wherein said first asymmetrical impedance element is returned to a point of reference potential, and a source of input signals connected in series with said first asymmetrical impedance element.

5. An amplifying electronic gate comprising a transistor having an emitter electrode, a collector electrode, and a base electrode, a first circuit interconnecting said emitter and base electrodes, a second circuit including a source of potential interconnecting said collector and base electrodes, a first two-terminal asymmetrically conducting impedance element connected in series with said base electrode, a second two-terminal asymmetrically conducting impedance element having one terminal connected to a similar terminal of said first asymmetrical impedance element, and means for applying control potentials to the other terminal of said second asymmetrical impedance element.

6. An amplifying electronic gate comprising a transistor having an emitter electrode, a collector electrode, and a base electrode, a first asymmetrically conducting device connected in series with said base electrode and common to a first circuit interconnecting said emitter and base electrodes and to a second circuit including a source of potential interconnecting said collector and base electrodes, a pair of similarly poled asymmetrically conducting devices connected in parallel with said first asymmetrical device, and means for selectively biasing each device of said pair of asymmetrical devices in its high or low resistance condition.

7. A transmission type gate comprising a transistor having an emitter electrode, a collector electrode, and a base electrode, a plurality of two-terminal asymmetrically conducting impedance elements having first terminals connected to said base electrode, a first circuit interconnecting said emitter electrode and the second terminal of one of said asymmetrical devices, a second circuit including a source of potential interconnecting said collector electrode and said second terminal of said one asymmetrical device, and means for applying control potentials to the second terminals of the other of said asymmetrical devices.

8. The combination in accordance with claim 7, and means for normally biasing the said other asymmetrical devices in their low resistance condition.

References Cited in the file of this patent

UNITED STATES PATENTS

| Number | Name | Date |
|---|---|---|
| 2,476,323 | Rack | July 19, 1949 |
| 2,486,776 | Barney | Nov. 1, 1949 |
| 2,531,076 | Moore | Nov. 21, 1950 |
| 2,569,347 | Schockley | Sept. 25, 1951 |
| 2,586,080 | Pfann | Feb. 19, 1952 |